(12) United States Patent
Weaver et al.

(10) Patent No.: US 10,586,720 B2
(45) Date of Patent: *Mar. 10, 2020

(54) WAFER PROCESSING SYSTEMS INCLUDING MULTI-POSITION BATCH LOAD LOCK APPARATUS WITH TEMPERATURE CONTROL CAPABILITY

(71) Applicant: Applied Materials, Inc., Santa Clara, CA (US)

(72) Inventors: William T. Weaver, Austin, TX (US); Joseph Yudovsky, Campbell, CA (US); Jason M. Schaller, Austin, TX (US); Jeffrey C. Blahnik, Leander, TX (US); Robert B. Vopat, Austin, TX (US); Malcolm N. Daniel, Jr., Austin, TX (US); Robert Mitchell, Winchester, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/292,790

(22) Filed: Mar. 5, 2019

(65) Prior Publication Data

US 2019/0198368 A1 Jun. 27, 2019

Related U.S. Application Data

(60) Continuation of application No. 15/172,180, filed on Jun. 3, 2016, now Pat. No. 10,256,125, which is a
(Continued)

(51) Int. Cl.
*H01L 21/67* (2006.01)
*H01L 21/677* (2006.01)
*H01L 21/687* (2006.01)

(52) U.S. Cl.
CPC .. *H01L 21/67201* (2013.01); *H01L 21/67754* (2013.01); *H01L 21/68707* (2013.01)

(58) Field of Classification Search
None
See application file for complete search history.

(56) References Cited

U.S. PATENT DOCUMENTS

| 5,380,682 A | 1/1995 | Edwards et al. |
| 5,607,009 A | 3/1997 | Turner et al. |
| (Continued) | | |

OTHER PUBLICATIONS

International Search Report and Written Opinion of International Application No. PCT/US2014/027994 dated Aug. 22, 2014.
(Continued)

*Primary Examiner* — Mark C Hageman
(74) *Attorney, Agent, or Firm* — Lowenstein Sandler LLP

(57) ABSTRACT

Various embodiments of wafer processing systems including batch load lock apparatus with temperature control capability are disclosed. The batch load lock apparatus includes a load lock body including first and second load lock openings, a lift assembly within the load lock body, the lift assembly including multiple wafer stations, each of the multiple wafer stations adapted to provide access to wafers through the first and second load lock openings, wherein the batch load lock apparatus includes temperature control capability (e.g., heating or cooling). Batch load lock apparatus is capable of transferring batches of wafers into and out of various processing chambers. Methods of operating the batch load lock apparatus are also provided, as are numerous other aspects.

19 Claims, 12 Drawing Sheets

Related U.S. Application Data division of application No. 14/211,123, filed on Mar. 14, 2014, now Pat. No. 9,378,994.

(60) Provisional application No. 61/879,076, filed on Sep. 17, 2013, provisional application No. 61/868,795, filed on Aug. 22, 2013, provisional application No. 61/787,117, filed on Mar. 15, 2013, provisional application No. 61/800,595, filed on Mar. 15, 2013.

(56) References Cited

U.S. PATENT DOCUMENTS

| | | | |
|---|---|---|---|
| 5,607,276 | A | 3/1997 | Muka et al. |
| 5,789,878 | A | 8/1998 | Kroeker et al. |
| 5,879,127 | A | 3/1999 | Grunes et al. |
| 6,267,549 | B1 | 7/2001 | Brown et al. |
| 6,364,592 | B1 | 4/2002 | Hofmeister |
| 6,379,095 | B1 | 4/2002 | Elliott et al. |
| 6,486,444 | B1 | 11/2002 | Fairbairn |
| 6,558,509 | B2 * | 5/2003 | Kraus ............... H01L 21/67017 156/345.54 |
| 6,582,175 | B2 | 6/2003 | Cox et al. |
| 6,688,375 | B1 | 2/2004 | Turner et al. |
| 6,722,834 | B1 | 4/2004 | Tepman |
| 6,841,200 | B2 | 1/2005 | Kraus et al. |
| 7,182,122 | B2 | 2/2007 | Koguchi et al. |
| 7,467,919 | B2 | 12/2008 | Weaver |
| 7,665,951 | B2 | 2/2010 | Kurita et al. |
| 7,822,324 | B2 | 10/2010 | Anwar |
| 8,092,659 | B2 | 1/2012 | Mullapudi et al. |
| 8,380,337 | B2 | 2/2013 | Hiroki |
| 8,616,820 | B2 | 12/2013 | Kurita et al. |
| 2001/0011423 | A1 | 8/2001 | Kato |
| 2006/0231027 | A1 | 10/2006 | Iwabuchi |
| 2006/0245852 | A1 | 11/2006 | Iwabuchi |
| 2007/0006936 | A1 | 1/2007 | Hosokawa |
| 2008/0257260 | A9 | 10/2008 | Brailove et al. |
| 2010/0178146 | A1 | 7/2010 | Kremerman et al. |
| 2010/0178147 | A1 | 7/2010 | Kremerman et al. |
| 2011/0183279 | A1 | 7/2011 | Okubo et al. |
| 2011/0265887 | A1 | 11/2011 | Lee |
| 2012/0170999 | A1 | 7/2012 | Sakaue |
| 2013/0039726 | A1 | 2/2013 | Brodine et al. |
| 2013/0115028 | A1 | 5/2013 | Kremerman et al. |
| 2013/0149076 | A1 | 6/2013 | Cox et al. |
| 2014/0271054 | A1 | 9/2014 | Weaver et al. |
| 2014/0271055 | A1 | 9/2014 | Weaver et al. |
| 2016/0284578 | A1 | 9/2016 | Weaver et al. |

OTHER PUBLICATIONS

Restriction Requirement of U.S. Appl. No. 14/211,123 dated Apr. 23, 2015.
May 1, 2015 Reply to Apr. 23, 2015 Restriction Requirement of U.S. Appl. No. 14/211,123.
Non-Final Office Action of U.S. Appl. No. 14/211,123 dated May 20, 2015.
Aug. 20, 2015 Reply to May 20, 2015 Non-Final Office Action of U.S. Appl. No. 14/211,123.
International Preliminary Report on Patentability and Written Opinion of International Application No. PCT/US2014/027994 dated Sep. 24, 2015.
Final Office Action of U.S. Appl. No. 14/211,123 dated Nov. 9, 2015.
Jan. 11, 2016 Reply to Nov. 9, 2015 Final Office Action of U.S. Appl. No. 14/211,123.
Advisory Action of U.S. Appl. No. 14/211,123 dated Jan. 29, 2016.
Notice of Allowance of U.S. Appl. No. 14/211,123 dated Mar. 28, 2016.
Non-Final Office Action of U.S. Appl. No. 15/172,180 dated May 4, 2017.
Aug. 4, 2017 Reply to May 4, 2017 Non-Final Office Action of U.S. Appl. No. 15/172,180.
Taiwan Search Report of Taiwan Application No. 103109730 dated Sep. 21, 2017.
Final Office Action of U.S. Appl. No. 15/172,180 dated Oct. 31, 2017.
Jan. 2, 2018 Reply to Oct. 31, 2017 Final Office Action of U.S. Appl. No. 15/172,180.
Advisory Action of U.S. Appl. No. 15/172,180 dated Jan. 10, 2018.
Non-Final Office Action of U.S. Appl. No. 15/172,180 dated Mar. 19, 2018.
Applicant-Initiated Interview Summary of U.S. Appl. No. 15/172,180 dated May 18, 2018.
Jun. 19, 2018 Reply to Mar. 19, 2018 Non-Final Office Action of U.S. Appl. No. 15/172,180.
Final Office Action of U.S. Appl. No. 15/172,180 dated Sep. 21, 2018.
Applicant-Initiated Interview Summary of U.S. Appl. No. 15/172,180 dated Oct. 9, 2018.
Nov. 13, 2018 Reply to Sep. 21, 2018 Final Office Action of U.S. Appl. No. 15/172,180.
Notice of Allowance of U.S. Appl. No. 15/172,180 dated Nov. 27, 2018.

* cited by examiner

WAFER PROCESSING SYSTEMS INCLUDING MULTI-POSITION BATCH LOAD LOCK APPARATUS WITH TEMPERATURE CONTROL CAPABILITY

RELATED APPLICATIONS

The present application is a continuation of, and claims priority from, U.S. patent application Ser. No. 15/172,180 filed Jun. 3, 2016, and entitled "WAFER PROCESSING SYSTEMS INCLUDING MULTI-POSITION BATCH LOAD LOCK APPARATUS WITH TEMPERATURE CONTROL CAPABILITY", which is a divisional of, and claims priority from, U.S. patent application Ser. No. 14/211,123 filed Mar. 14, 2014, and entitled "MULTI-POSITION BATCH LOAD LOCK APPARATUS AND SYSTEMS AND METHODS INCLUDING SAME", now U.S. Pat. No. 9,378,994, which claims priority from U.S. Provisional Patent Application No. 61/879,076, filed Sep. 17, 2013, entitled "SUBSTRATE DEPOSITION SYSTEMS, ROBOT TRANSFER APPARATUS, AND METHODS FOR ELECTRONIC DEVICE MANUFACTURING", U.S. Provisional Patent Application No. 61/868,795, filed Aug. 22, 2013, entitled "SUBSTRATE DEPOSITION SYSTEMS, ROBOT TRANSFER APPARATUS, AND METHODS FOR ELECTRONIC DEVICE MANUFACTURING", U.S. Provisional Patent Application No. 61/787,117, filed Mar. 15, 2013, entitled "SUBSTRATE DEPOSITION SYSTEMS, APPARATUS AND METHODS FOR ELECTRONIC DEVICE MANUFACTURING", and U.S. Provisional Patent Application No. 61/800,595, filed Mar. 15, 2013, entitled "WAFER HANDLING SYSTEMS AND METHODS FOR SMALL BATCHES OF WAFERS". Each of the above applications is hereby incorporated by reference in its entirety for all purposes herein.

FIELD

Embodiments of the invention relate to semiconductor device manufacturing, and more particularly to substrate processing systems and methods including batch load lock apparatus.

BACKGROUND

Within a semiconductor device manufacturing process, a wafer handling system may move wafers into and out of various process chambers to undergo processing. Some chambers may process simultaneously small batches of wafers (e.g., about six wafers), such as in a carousel processing system. Some known wafer handling systems may be capable of transferring wafers through a manufacturing process at a relatively high throughput, but may only transfer wafers one at a time.

Accordingly, improved wafer handling systems and methods capable of transferring small batches of wafers into and out of various chambers are sought.

SUMMARY

In a first aspect, a wafer processing system is provided. The wafer processing system includes a transfer chamber, one or more processing chambers coupled to the transfer chamber, a batch load lock apparatus coupled to the transfer chamber, the batch load lock apparatus including multiple wafer stations, and a robot within the transfer chamber and configured to transfer wafers between the one or more processing chambers and the batch load lock apparatus, wherein the batch load lock apparatus includes temperature control capability.

In another aspect, a wafer processing system is provided. The wafer processing system includes a transfer chamber, one or more processing chambers coupled to the transfer chamber, the one or more processing chambers included in one or more carousels, a first batch load lock apparatus coupled to the transfer chamber, the first batch load lock apparatus including multiple wafer stations and temperature control capability, a second batch load lock apparatus coupled to the transfer chamber, the second batch load lock apparatus including multiple wafer stations and temperature control capability, a robot within the transfer chamber and configured to transfer wafers between the one or more processing chambers and the first batch load lock apparatus and the second batch load lock apparatus, and a mainframe body including a first wall, a second wall, a third wall, and a fourth wall, the first batch load lock apparatus coupled to the first wall of the mainframe body, a first carousel of the one or more carousels coupled to the third wall of the mainframe body opposite the first batch load lock, the second batch load lock apparatus coupled to the second wall of the mainframe body, and a second carousel of the one or more carousels coupled to the fourth wall of the mainframe body opposite the second batch load lock.

In another aspect, a wafer processing system is provided. The wafer processing system includes a transfer chamber, one or more processing chambers coupled to the transfer chamber, a batch load lock apparatus coupled to the transfer chamber, the batch load lock apparatus including multiple wafer stations and temperature control capability, a robot within the transfer chamber and configured to transfer wafers between the one or more processing chambers and the batch load lock apparatus, and a mainframe body including a first wall, a second wall, a third wall, and a fourth wall, a first processing chamber of the one or more processing chambers coupled to the first wall, a second processing chamber of the one or more processing chambers coupled to the second wall, a third processing chamber of the one or more processing chambers coupled to the third wall, and the batch load lock apparatus coupled to the fourth wall.

Other features and aspects of the invention will become more fully apparent from the following detailed description of example embodiments, the appended claims, and the accompanying drawings.

DETAILED DESCRIPTION

Embodiments described herein relate to semiconductor processing systems, and wafer handling apparatus and methods including batch load lock apparatus configured and adapted to transfer small batches of wafers (e.g., 5 or 6 wafers). In some embodiments, temperature control capability is provided by the batch load lock apparatus. Transfer by the wafer handling system may be into or out of one or more processing chambers in a semiconductor processing system. In some embodiments, the wafer processing chambers may be capable of processing small batches of wafers simultaneously, such as in carousel wafer processing systems.

The wafer handling apparatus, batch load lock apparatus may have a relatively small footprint and may maintain about the same or improved wafer throughput as compared to known wafer handling systems and methods capable of transferring only one wafer at a time. Embodiments of wafer handling apparatus and batch load lock apparatus as described herein may be applicable to transferring wafers from ALD (atomic layer deposition) carousels or other process chambers to a factory interface, and vice versa.

In accordance with one or more embodiments, an improved load lock apparatus is provided capable of transferring a batch of wafers. The batch load lock apparatus described herein provides the capability of loading and unloading a wafer processing system in a simple and effective manner. The batch load lock apparatus may interface with a factory interface that is configured and adapted to transfer wafers between the batch load lock and wafer carriers docked to the factory interface.

Further examples and description of the various embodiments of the invention are described with reference to FIGS. 1-8 herein.

Figure 1:
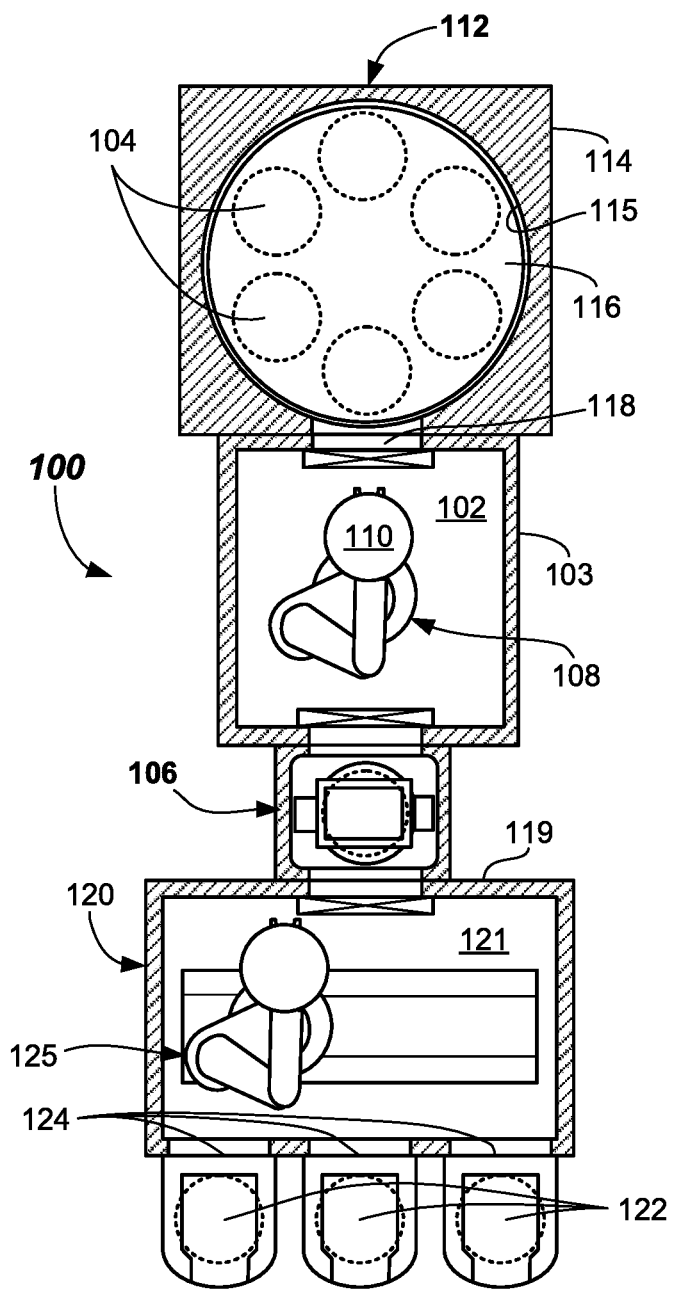
FIG. 1 illustrates a wafer processing system including a batch load lock apparatus according to embodiments.

Referring now to FIG. 1, a first embodiment of a wafer processing system 100 is shown. Wafer processing system 100 includes a transfer chamber 102, one or more processing chambers 104 (a few labeled) that are accessed from the transfer chamber 102, a batch load lock apparatus 106 coupled to the transfer chamber 102, and a robot 108 within the transfer chamber 102 and configured to transfer wafers 110 between the one or more processing chambers 104 and the batch load lock apparatus 106. In the depicted embodiment, the batch load lock apparatus 106 includes multiple wafer stations, which may be stacked vertically.

The batch load lock apparatus may include wafer temperature control capability. For example, one or more of the multiple wafer stations may include temperature control capability. Temperature control capability may include active heating, active cooling, or both. Some or all of the stations in the batch load lock apparatus 106 may include heating cooling or both, as will be described further herein. Other means for accomplishing heating and cooling of the wafer batch are described. Accordingly, in some embodiments, the batch load lock apparatus 106 may include the ability to preheat wafers 110 prior to transferring them to the processing chambers 104 on the robot 108. In other embodiments, the batch load lock apparatus 106 may include the ability to cool the wafers 110 after returning from the processing chambers 104 and being transferred back to the factory interface 120.

In more detail, the transfer chamber 102 may be formed by walls of a mainframe structure 103. One or more of the walls may be removable to provide service access. The robot 108 within the transfer chamber 102 may include any suitable structure configured and adapted to transfer wafers 110 between the one or more processing chambers 104 and the batch load lock apparatus 106. The robot 108 may be any suitable multi-axis robot apparatus as described in U.S. Pat. Nos. 5,789,878; 5,879,127; 6,267,549; 6,379,095; 6,582,175; and 6,722,834; and US Pat. Pubs. 2010/0178147; 2013/0039726; 2013/0149076; 2013/0115028; and 2010/0178146, for example.

The robot 108 may be housed, at least partially or fully, within the transfer chamber 102. The robot 108 may be configured and adapted to place or extract wafers 110 (e.g., patterned or unpatterned substrates) to and from the batch load lock apparatus 106 and one or more process chambers 104. In some embodiments, the transfer chamber 102 may be operated under a vacuum, for example, and the robot 108 may be a vacuum robot.

In the depicted embodiment, the one or more process chambers 104 may be included in a carousel 112, such as the atomic layer deposition carousel shown. Carousel 112 may have carousel body 114 having a carousel chamber 115 formed therein, and a carousel platform 116 rotatable within the carousel chamber 115 and having multiple wafer placement locations (shown as dotted circles). For example, the carousel platform 116 may include three, four, five, six, or even more wafer placement locations. Other numbers of wafer placement locations may be used. Each wafer placement location may be deemed a process chamber 104, where a different process may be taking place simultaneously at two or more of the wafer placement locations. In some embodiments, heating may take place at one wafer placement location, while another wafer placement location may be undergoing a deposition process. Process chamber 104 may be separated by close-tolerance walls, various gas separators, or the like. Other processes may take place at the process chambers 104.

The carousel 112 may include one or more process chambers 104 therein, that are coupled to the transfer chamber 102 via an opening 118. Process chambers 104 within the carousel 112 may be adapted to carry out any number of process steps, such as atomic layer deposition (ALD) or the like on the wafers 110. Other processes may also be carried out therein. Access by the robot 108 to load and unload the wafers 110, before and after processing, is through opening 118, as the respective wafers 110 on the wafer placement locations are aligned with the opening 118. Processes are carried out as the wafers 110 are rotated about on the wafer placement locations of the carousel platform 116. Wafer processing carousels are well known and will not be further described herein.

The batch load lock apparatus 106 may be coupled, as shown, to the transfer chamber 102 opposite from the opening 118. Other orientations of the opening 118 and batch load lock apparatus 106 may be used. Batch load lock apparatus 106, in one or more embodiments, may include multiple wafer stations (e.g., 536A-536G) as will be described with reference to at least FIGS. 5A-5E and 6 herein.

The carousel 112 and the batch load lock 106 may include slit valves at their ingress/egress, which may be configured and adapted to open and close when placing or extracting wafers 110 to and from the various chambers thereof. Slit valves may be of any suitable conventional construction, such as L-motion slit valves. In some embodiments, the slit valves at the opening to the batch load lock apparatus 106 from the transfer chamber may be double height to enable the different height end effectors to readily access several stations of the batch load lock apparatus without a vertical height change of the robot 108, such as when a dual end effector robot is used as the robot 108. Similarly, batch load lock apparatus 106 may include a double- or triple-, or more, sized opening to allow loading and unloading of multiple wafers 110 to and from the factory interface 120.

Batch load lock apparatus 106 may be coupled between the mainframe structure 103 and the factory interface body 119 of the factory interface 120. Factory interface 120 may include a factory interface chamber 121 adapted to receive one or more wafers 110 from wafer carriers 122 docked at load ports 124 of the factory interface 120. Wafers 110 may be transferred by a factory interface robot 125 housed within the factory interface chamber 121 of the factory interface 120, and the transfer may take place in any sequence or direction. Factory interface robot 125 in the factory interface 120 may be entirely conventional, except that it may include multiple stacked end effectors enabling multiple wafers 110 to be transferred at once. Wafers 110, as used herein, means articles used to make electronic devices or circuit components, such as silica-containing wafers, glass discs, masks, or the like, whether patterned or unpatterned.

Now referring to FIGS. 5A-5E, batch load lock apparatus 106 may include a load lock body 530 having walls forming a load lock chamber 532 therein. The depicted embodiment of the batch load lock apparatus 106 includes temperature control capability. In particular, the batch load lock apparatus 106 includes wafer temperature control capability within the load lock chamber 532.

In more detail, batch load lock apparatus 106 includes a lift assembly 534 positioned within the load lock body 530, the lift assembly 534 including multiple wafer stations (e.g., wafer stations 536A-536G). Each wafer station 536A-536G is configured and adapted to provide access to wafers 110 by the robots 108, 125 through first and second load lock openings 538A, 538B. Wafer station 536A-536G may be spaced at equal vertical intervals, such as a pitch of between about 25 mm and about 40 mm, for example.

As shown, lift assembly 534 includes seven wafer stations 536A-536G. However, any suitable number of wafer station 536A-536G may be provided, such as 3, 4, 5, 6, 7 or more.

Figure 5A:
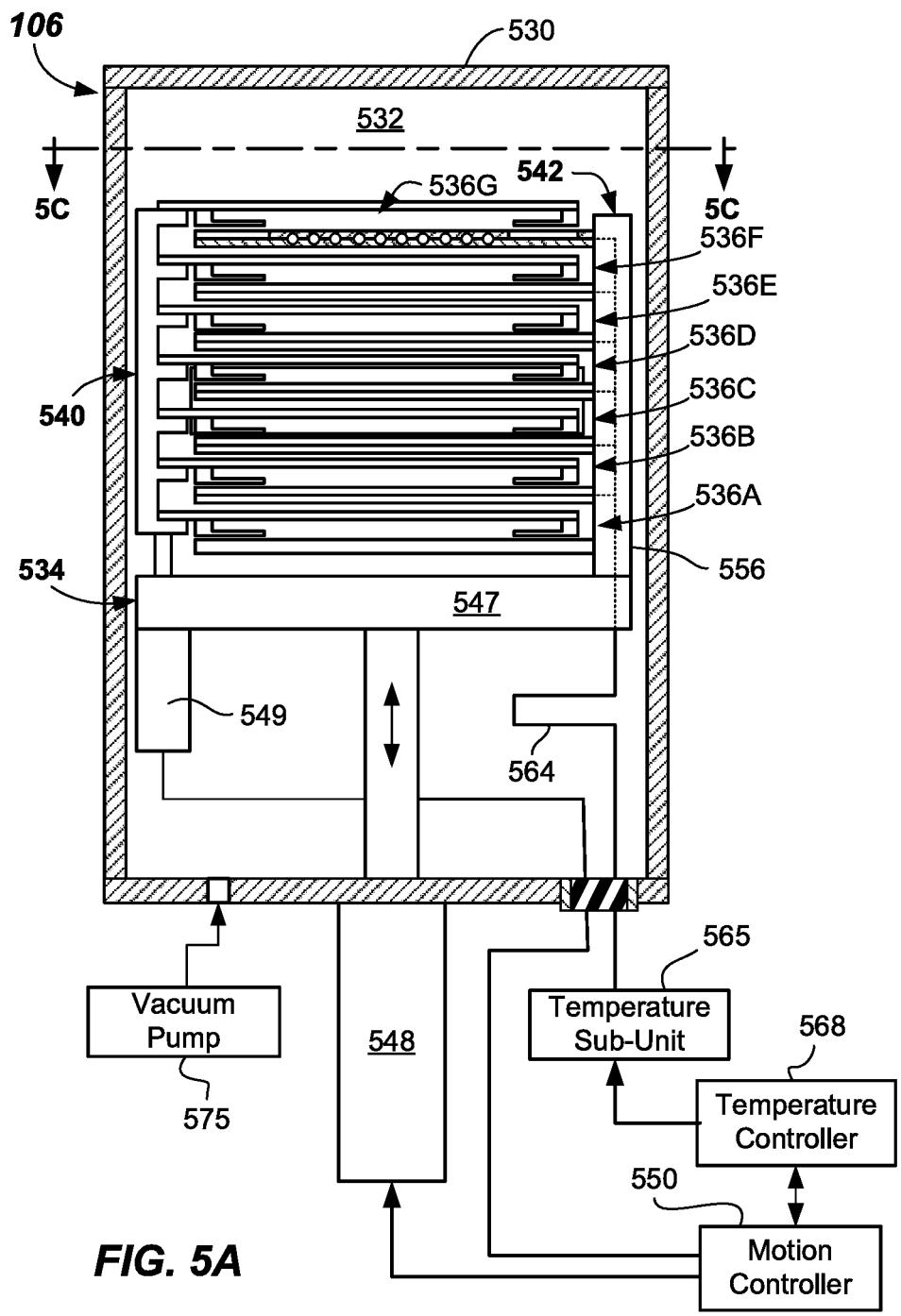
FIG. 5A illustrates a cross-sectional side view of a batch load lock apparatus with temperature control capability according to embodiments.
Figure 5B:
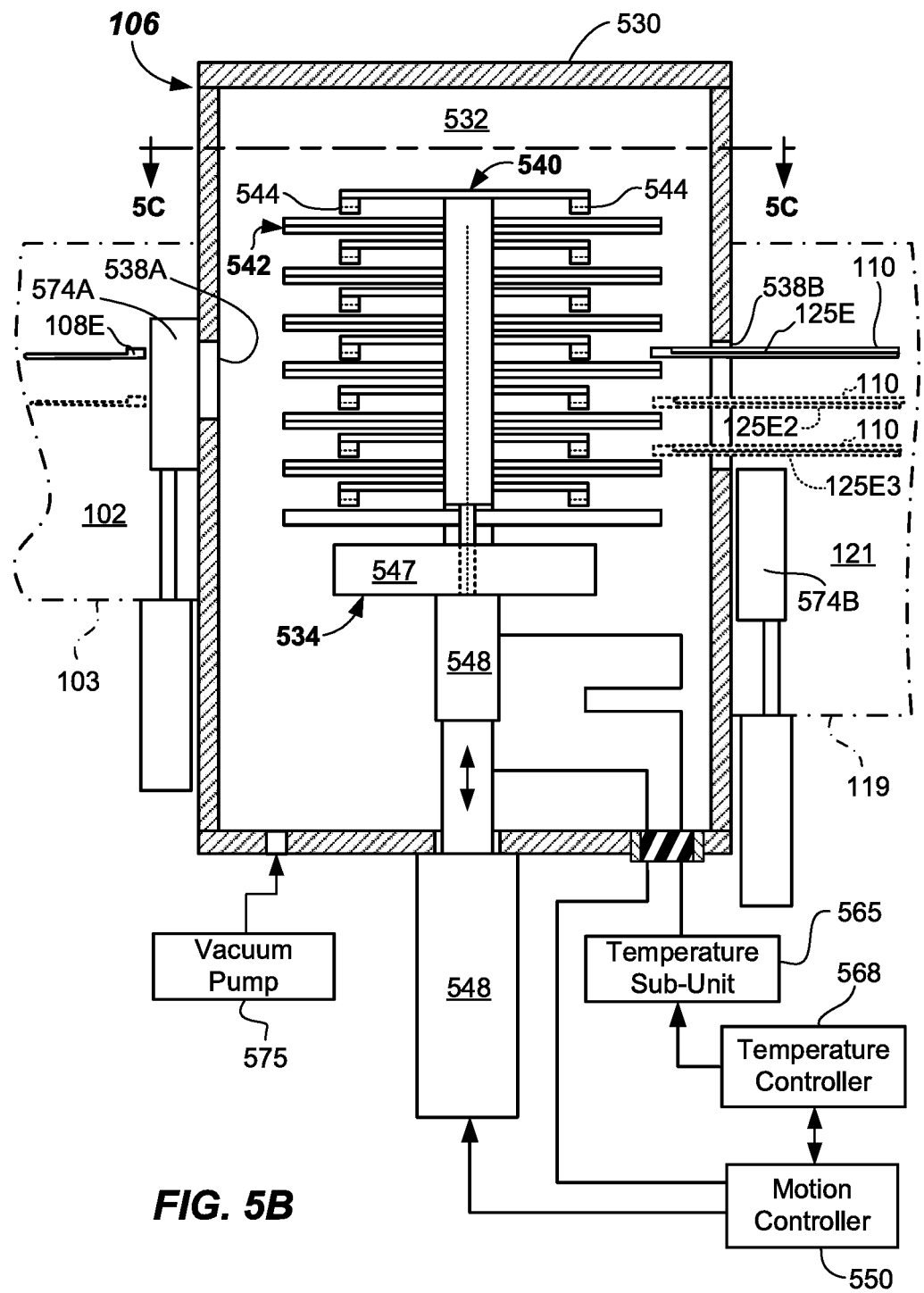
FIG. 5B illustrates another cross-sectional side view of a batch load lock apparatus with temperature control capability according to embodiments.
Figure 5C:
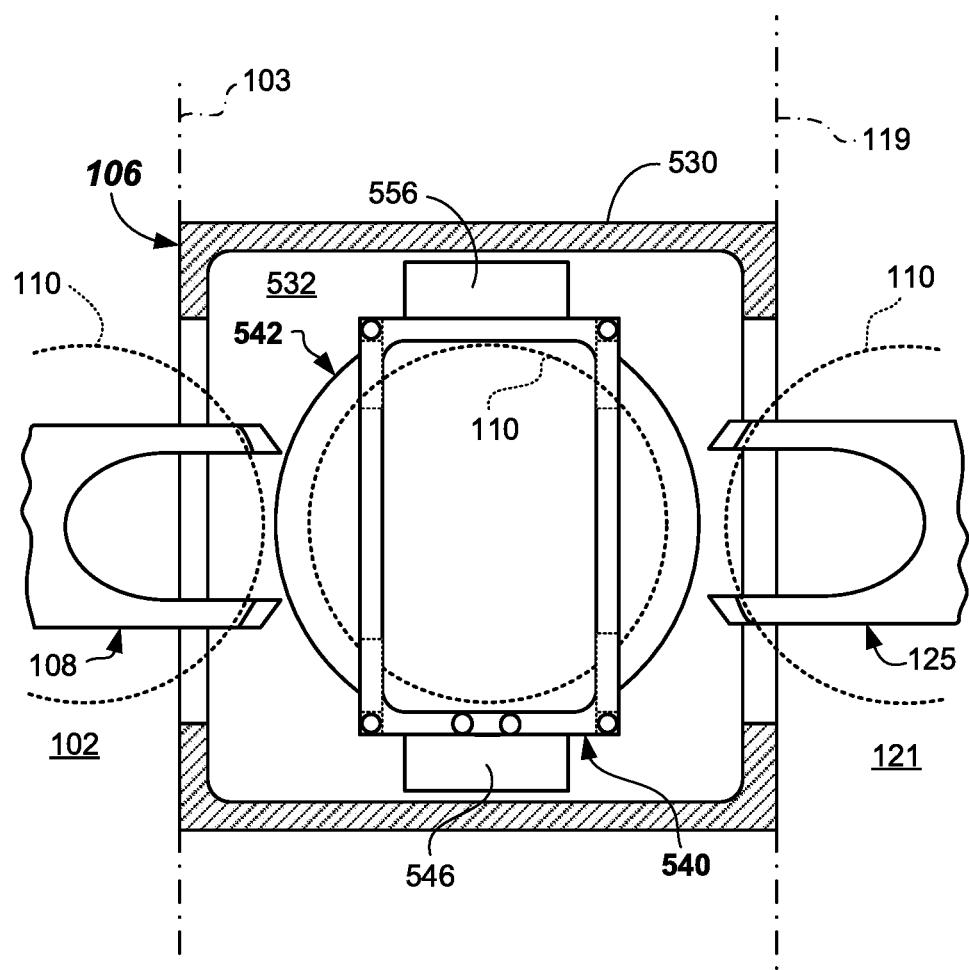
FIG. 5C illustrates a cross-sectioned top view of a batch load lock apparatus with temperature control capability according to embodiments.
Figure 5D:
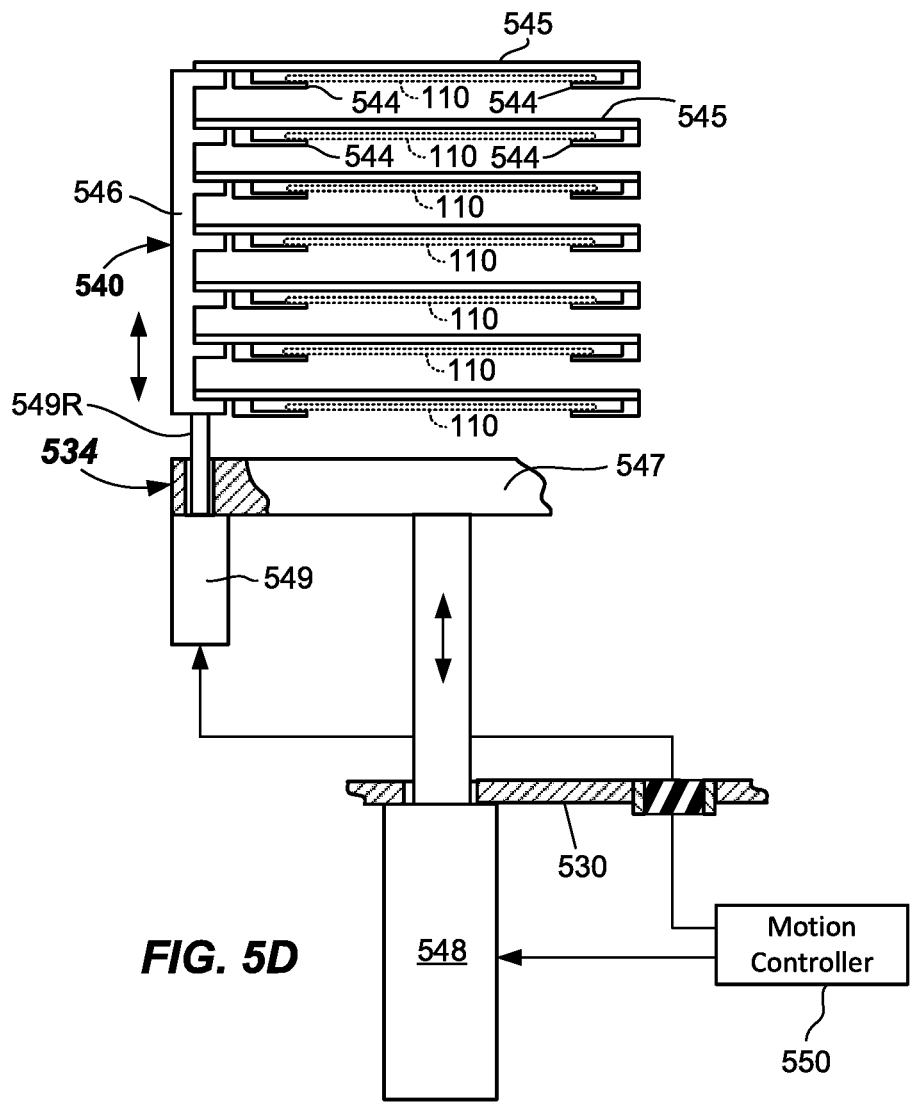
FIG. 5D illustrates a side plan view of a portion of a lift assembly of a batch load lock apparatus according to embodiments (shown in isolation with other components removed for clarity).
Figure 5E:
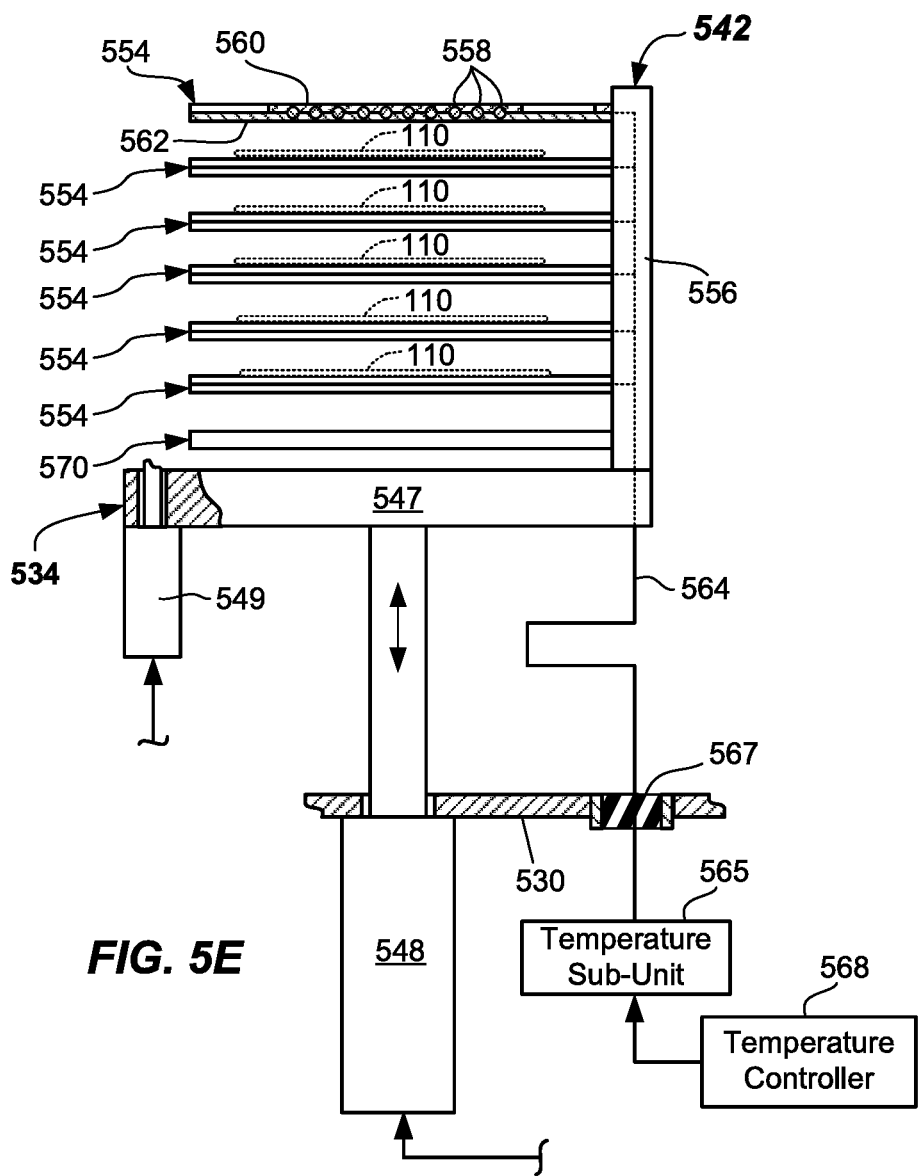
FIG. 5E illustrates a side plan view of a portion of a lift assembly of a batch load lock apparatus according to embodiments (shown in isolation with other components removed for clarity).

Lift assembly 534 may include temperature control capability, such as by including capability adapted to move wafers 110 towards and away from the multiple temperature control platforms 554 (best shown in FIG. 5E). As shown, end effectors 108E, 125E of robots 108, 125 are adapted to accept wafers from, and deliver multiple wafers to, first and second load lock openings 538A, 538B.

Lift assembly 534 may include a support stack 540 and temperature control stack 542, which may be moveable (e.g., vertically) relative to one another. The support stack 540 includes multiple wafer supports 544 (a few labeled) that may be stacked vertically, each being adapted to support a wafer 110, as best shown in isolation in FIG. 5D (several dotted wafers 110 shown). The multiple wafer supports 544 may be attached to support members 545, which may be attached to a stack riser 546 at various spaced vertical locations. Stack riser 546 and support members 545 may be made integral in some embodiments.

Motion of the lift assembly 534 may be accomplished by action of a primary actuator 548 via control signal from motion controller 550. Motion controller 550 may be any suitable controller including processor and memory and other suitable electronics able to carry out motion control programs. Motion controller 550 may interface with other controllers, such as temperature controller 568, to be further described herein, and processing controller (not shown) for the system 100.

Primary actuator 548 is operable to raise and lower a base 547, and the support stack 540 and temperature control stack 542 including multiple temperature control platforms 554 that are coupled to the base 547. This primary vertical motion is adapted to move desired wafer stations (one or more stations 536A-536G) into vertical alignment with the respective openings 538A, 538B to allow exchange of wafers 110 therefrom. Additionally, the support stack 540 may be moveably coupled to the base 547 and secondarily moveable (e.g., vertically) relative to a base 547 of the lift assembly 534. Motion of the support stack 540 relative to the base 547 may be produced by a secondary actuator 549, which may be coupled to the underside of the base 547, for example. Actuator rod 549R of the secondary actuator couples to the stack riser 546 and its motion causes motion of the stack riser 546.

In the depicted embodiment, the batch load lock apparatus 106 includes a temperature control stack 542, as best shown in FIG. 5E (shown in isolation with the other items not shown). The temperature control stack 542 includes multiple temperature control platforms 554 within the lift assembly 534 including temperature control capability, i.e., the ability to control temperature of the wafers 110. In particular, depending upon the embodiment, the temperature control stack 542 may include either of: 1) active heating capability, or 2) active cooling capability, to be more fully described herein. Wafers 110 may be brought into thermal contact (e.g., very close proximity or in actual physical contact) with the respective temperature control platforms 554.

Thus, in one embodiment, for example, wafers 110 may be pre-heated before being transferred into the transfer chamber 102 by being brought into thermal contact with the respective temperature control platforms 554 of the temperature control stack 542. Wafers 110 may be actively pre-heated, for example, to a temperature of between about 200° C. and about 450° C. by the temperature control platforms 554 before moving into the transfer chamber 102 by robot (e.g., robot 108 of FIG. 1).

In the depicted embodiment, the temperature control stack 542 includes the multiple temperature control platforms 554 that are coupled to a distributor riser 556. In the depicted embodiment, the respective temperature control platforms 554 are shown coupled (e.g., attached) to the distributor riser 556 at spaced (e.g., evenly spaced) vertical locations. Attachment to the distributor riser 556 may be by suitable fasteners (e.g., bolts or screws or the like). Each of the temperature control platforms 554 may include active thermal imparting capability, i.e., the ability to heat or cool the wafers in thermal contact therewith.

For example, in the illustrated embodiment of FIG. 5E, resistive heating may be employed, wherein an arrangement of one or more resistive heating elements 558 are provided in, or on, at least some of the temperature control platforms 554. For example, the resistive heating elements 558 may traverse through channels or grooves that may be formed in or on conducting plates 560 of the temperature control platforms 554. Temperature control platforms 554 may include insulating plates 562 on an underside thereof. Conducting plates 560 may be made of a conductive material having a relatively high thermal conduction coefficient, such as aluminum.

Conduits 564 (e.g., electrical conduits) may supply electrical power to the resistive heating elements 558. The conduits 564 may be configured to pass through one or more channels in the distributor riser 556 or be otherwise appropriately routed. Conduits 564 connect to, and provide power from, a temperature sub-unit 565, such as a heater driving unit. Conduits 564, as well as the control lines to the secondary actuator 549, may pass through a wall of the load lock body 530 via one or more sealed connectors 567.

Temperature sub-unit 565 may provide heating power between about 500 W and 3,000 W, for example. The power supplied to the resistive heating elements 558 may be controlled via control signals from the temperature controller 568. Temperature controller 568 may include suitable process and memory to carry out temperature control programs. Control of the respective temperature control platforms 554 may be individually, globally or zonally controlled for temperature to attempt to provide substantially the same temperature exposure to the various wafers 110. Some or all of the respective temperature control platforms 554 may include temperature control capability. However, one or more of the platforms may be devoid of temperature control, i.e., they may be uncontrolled platforms 570 may be used for storage or dummy or calibration wafer 110A.

Figure 6:
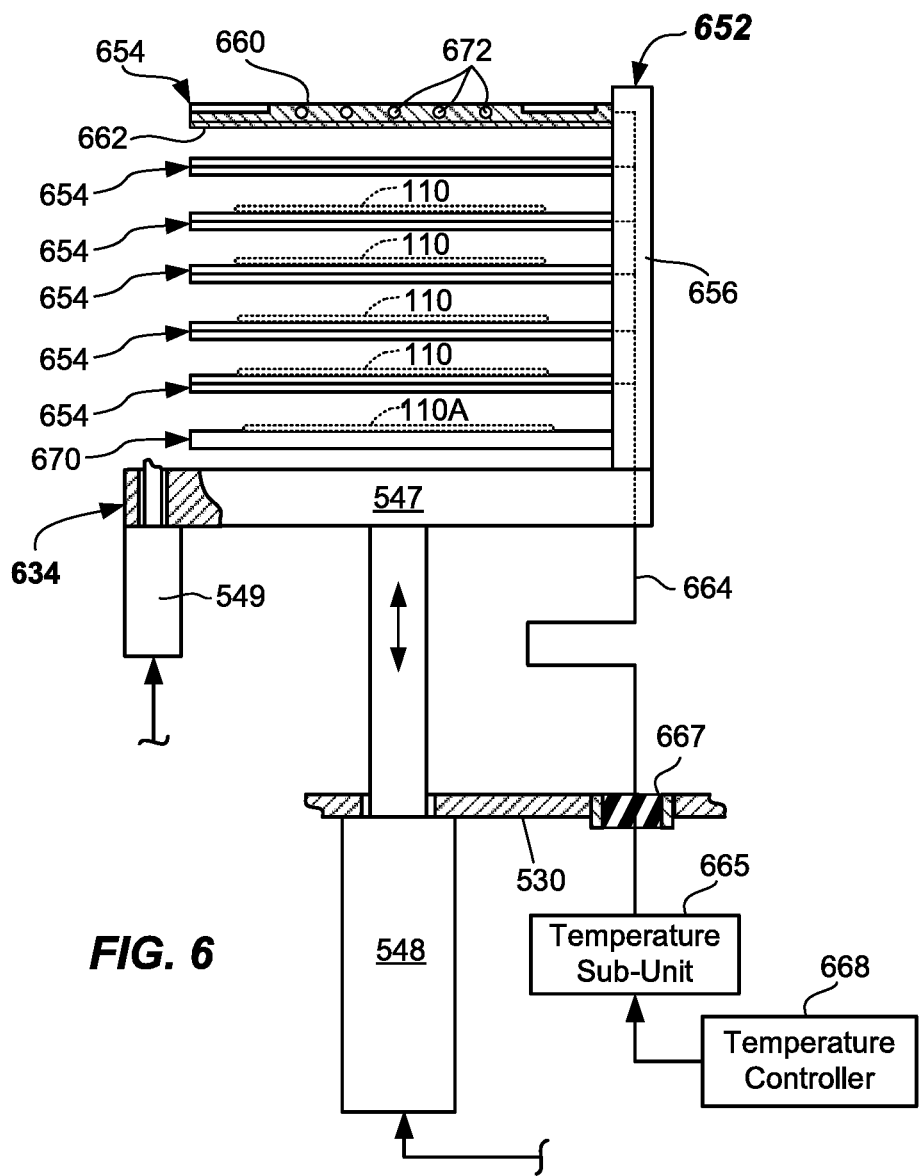
FIG. 6 illustrates a side plan view of a portion of an alternate lift assembly of a batch load lock apparatus according to embodiments (shown in isolation with other components removed for clarity).

In another embodiment, as shown in FIG. 6, the temperature control platforms 654 of the temperature control stack 652 may be configured to include hydraulic heating or cooling, and may be used instead of the temperature control stack 542 described above in the batch load lock apparatus 106. In this embodiment, an arrangement of fluid passages 672 may be provided in at least some of the temperature control platforms 654. Heated or cooled thermal fluid (e.g., water, glycol, or combinations thereof) may be passed through the fluid passages 672. There may be an inflow and outflow for each of the temperature control platforms 654. Fluid passages 672 may be made by cross drilling and plugging, for example. Other means for forming the fluid passages 672 may be used.

Fluid flow may be supplied by conduits 664 (e.g., fluid channels). Conduits 664 in this embodiment may comprise multiple channels formed in the distributor riser 656 that provide fluid to, and return fluid from, the respective temperature control platforms 654. Interfaces between the distributor riser 656 and the various platforms 654 may be sealed, such as with o-rings. Separate conduits 664 may be piped to each of the temperature control platforms 654 to allow individual temperature control, and enable heating (or cooling) each wafer 110 to a common target temperature or temperature range.

Temperature control platforms 654, as before, may comprise conducting plates 660. An insulating member 662, such as a layer or plate of insulation, may be provided on an underside thereof. Conducting plates 660 may be made of a conductive material having a relatively high thermal conduction coefficient, such as aluminum. Conduits 664 passing through the load lock chamber 532 may be braided fluid-carrying lines or hoses. Conduits 664 connect to, and provide heated or cooled fluid from, the temperature sub-unit 665, which may be a fluid heating and/or cooling unit. Conduits 664 may pass through a wall of the load lock body 530 via one or more sealed connectors 667, in the same manner as previously described.

Temperature sub-unit 665 may function to supply heated fluid to heat the temperature control platforms 654, and thus the wafers 110 in the load lock chamber 532, to a desired temperature of between about 200° C. and 450° C., for example. This may be performed as a batch, prior to the batch being provided to the transfer chamber 102.

In other embodiments, temperature sub-unit 665 may function to cool the temperature control platforms 654 in the load lock chamber 532 to a desired temperature of less than about 70° C., or between about 70° C. and 40° C., for example, by provide a cooling fluid to the temperature control platforms 654 through the conduits 664.

In each case, the temperature of the fluid supplied to the temperature control platforms 654 may be controlled via control signals from a temperature controller 668. As before, some or all of the respective temperature control platforms 654 may include temperature control capability. However, one or more of the platforms may be devoid of temperature control, i.e., may be an uncontrolled platform 670 that may be used for storage or other purposes.

In each embodiment described herein, one or more sensors may be provided on, or proximate to, the temperature control platforms 554, 654 to provide temperature feedback to the temperature controller 568, 668. Temperature may be globally controlled, or individually controlled, zonally controlled, or any combination thereof.

It should now be apparent that embodiments of the batch load lock apparatus 106 herein allow the wafers 110 to be heated upon going into the transfer chamber or process chamber. Furthermore, in some embodiments, the wafers 110 may be cooled on the way out of the transfer chamber 102. Optionally, heating may be provided in the batch load lock apparatus 106 on wafers 110 going in for processing, and cooldown stations may be provided within the factory interface 120 (otherwise referred to as an Equipment Front End Module (EFEM)) as the wafers 110 come out after processing.

Again referring to FIG. 1, in some embodiments, a number of the wafer stations in the batch load lock apparatus 106 may be greater than or equal to a number of wafers 110 comprising a batch in the processing chambers 104. For example, a batch in the depicted embodiment of FIG. 1 is six wafers, i.e., equal to the number of stations on the carousel platform 116 of the carousel 112. The batch load lock apparatus 106 may include multiple wafer receiving stations, such as three or more, four or more, five or more, or six or more wafer stations 536A-536G. Some or all the wafer stations 536A-536G may include heating or cooling capability.

Figure 2:
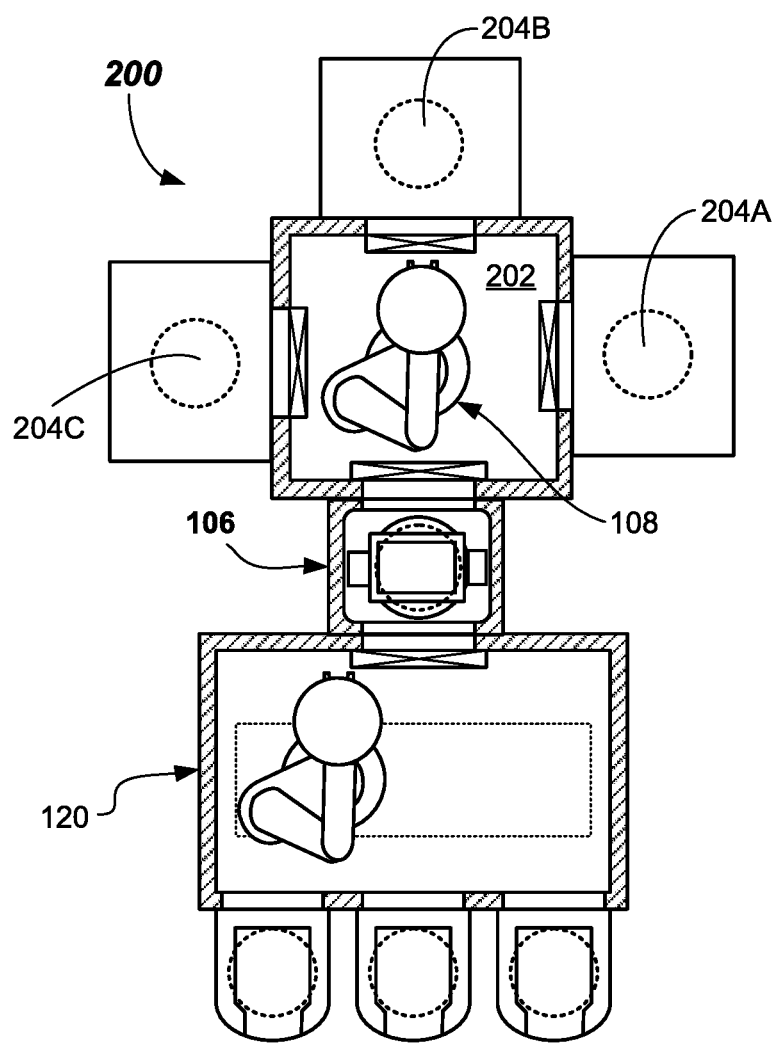
FIG. 2 illustrates another wafer processing system including a batch load lock apparatus according to embodiments.

In the embodiment of wafer processing system 200 shown in FIG. 2, for example, a batch is three wafers (e.g., one in each of process chambers 204A, 204B, and 204C). Thus, the batch load lock apparatus 106, which is the same as described above, may have three or more wafer stations therein. In some embodiments, a multiple of a number of wafers in the batch may be used, such as 2×, 3×, or the like.

For example, if the wafer processing system 200 includes three wafers 110, then the batch load lock apparatus 106 may have 6 wafer stations therein (for 2x), or may have 9 wafer stations therein (for 3x). Other than the different configuration for the process chambers 204A-204C and transfer chamber 202, as compared to FIG. 1, all the other components for the FIG. 2 embodiment are as described in FIG. 1. In the embodiment of FIG. 2, the batch load lock apparatus 106 may have the configuration shown in FIGS. 5A-5E or optionally include the temperature control stack 652 of FIG. 6, and may include active heating, active cooling on some or all the wafer stations therein.

Figure 3:
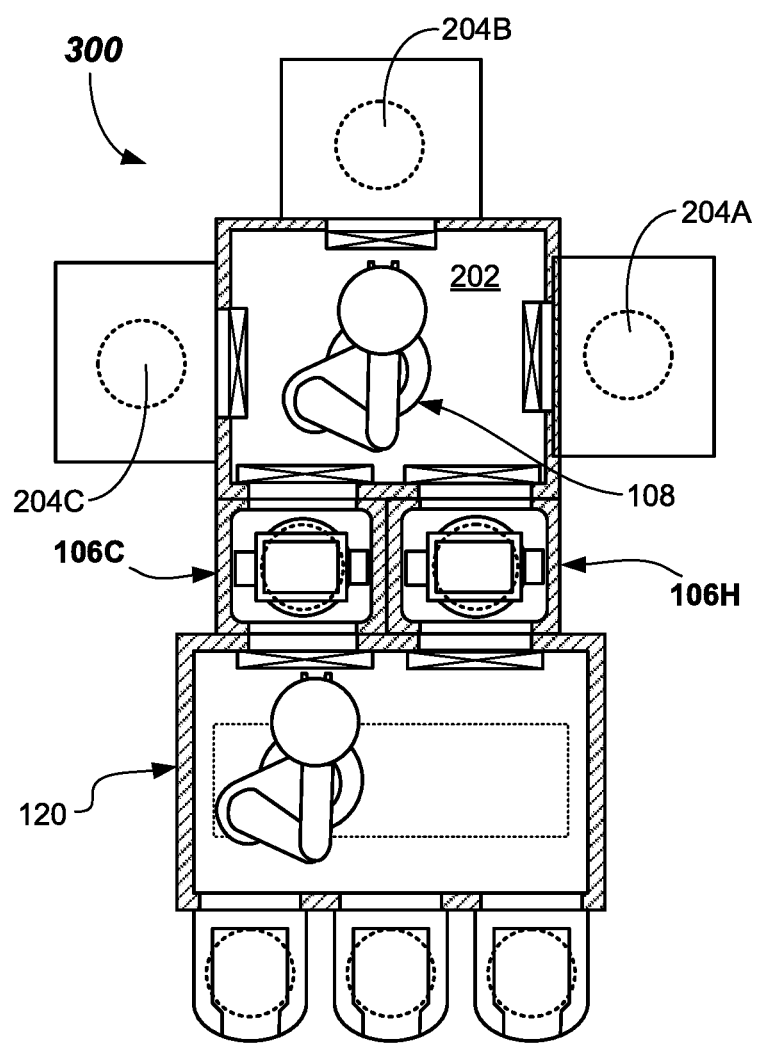
FIG. 3 illustrates another wafer processing system including multiple batch load lock apparatus according to embodiments.

FIG. 3 illustrates another wafer processing system 300, for example. In this wafer processing system 300, a batch is three wafers (e.g., one in each of process chambers 204A, 204B, and 204C). However, a larger number of process chambers may be included, by adding additional coupled mainframes, adding more processing chambers per side (e.g., twinned chambers), and the like. In this embodiment, multiple batch load lock apparatus 106H and 106C are provided. One batch load lock apparatus 106H may include heating therein. The other batch load lock apparatus 106C may include cooling therein. Otherwise, the structure is the same as batch load lock apparatus 106 described herein.

Some or all of the multiple wafer stations in batch load lock apparatus 106H may include heating. Some or all of the multiple wafer stations in batch load lock apparatus 106C may include cooling. In some embodiments, a multiple of the number of wafers in the batch may be used, such as 1x, 2x, 3x, or the like, in one or both of the batch load lock apparatus 106C, 106H. For example, if the wafer processing system 300 includes a batch of three wafers (as shown), then each batch load lock apparatus 106C, 106H may include 3 wafer stations therein (for 1x), may include 6 wafer stations therein (for 2x), or may have 9 wafer stations therein (for 3x). Other than the different configuration for the process chambers 204A-204C, as compared to FIG. 1, and the use of multiple batch load lock apparatus 106H, 106C, all the other components for the FIG. 3 embodiment are as described in FIG. 1 and FIG. 2. In the embodiment shown in FIG. 3, the batch load lock apparatus 106H may have the configuration shown in FIGS. 5A-5E or include the temperature control stack shown in FIG. 6, and may include active heating. The batch load lock apparatus 106C may have the configuration shown in FIG. 6, for example, and may include active cooling. Active heating and cooling may be provided on some or all the wafer stations in each of the batch load lock apparatus 106H, 106C.

Figure 4:
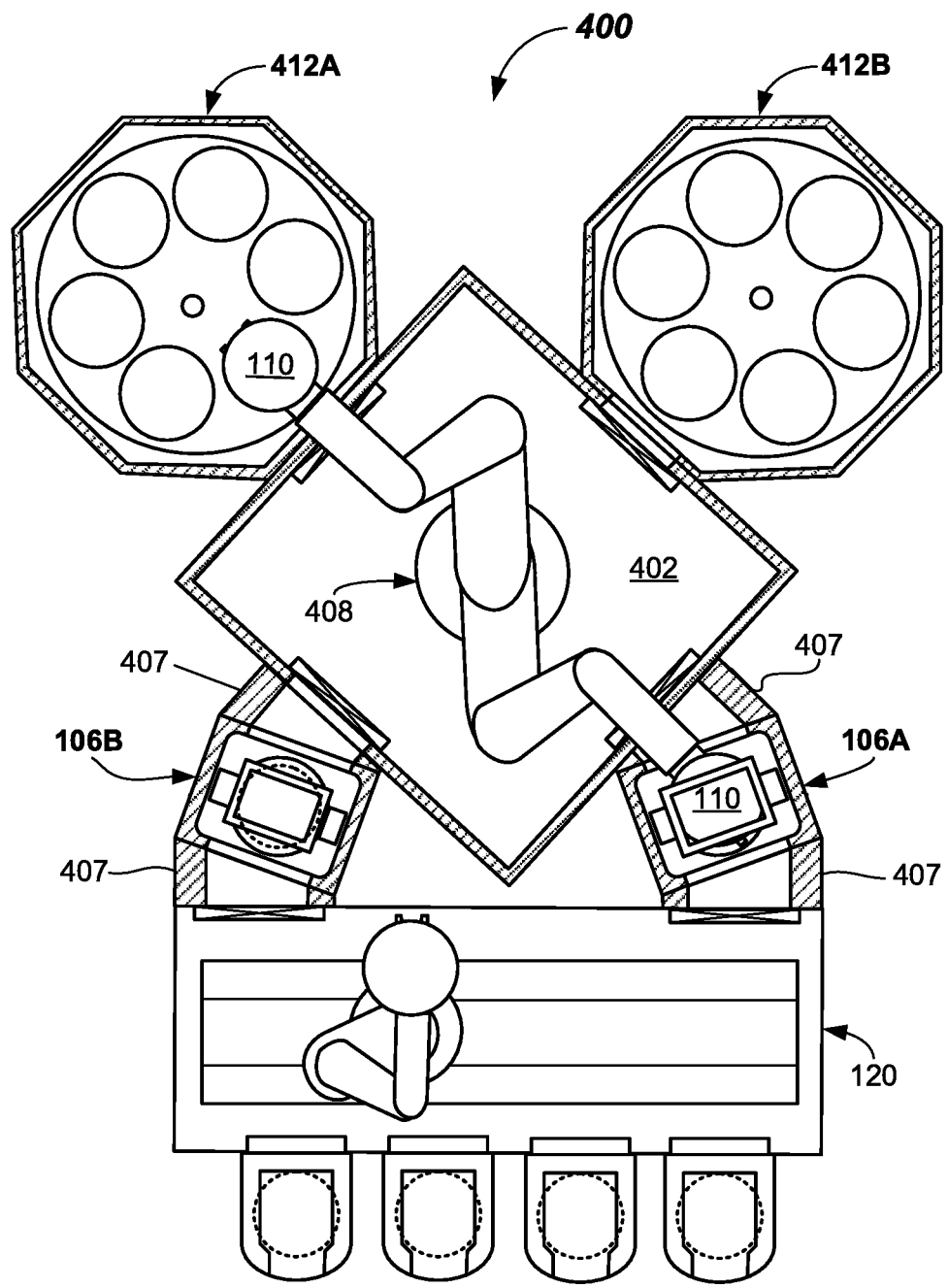
FIG. 4 illustrates another wafer processing system including two batch load lock apparatus according to embodiments.

FIG. 4 illustrates another wafer processing system 400. In this wafer processing system 400, a batch is six wafers (e.g., one in each station of the carousels 412A, 412B). One carousel 412A or 412B is unloaded as the other is processing. In this embodiment, multiple batch load lock apparatus 106A, 106B are provided. Batch load lock apparatus 106A, 106B may be the same as batch load lock apparatus 106 described herein. Suitable spacers 407 may be used to adapt the batch load lock apparatus 106A, 106B to the factory interface 120 and the transfer chamber 402 as shown.

In this FIG. 4 embodiment, the first batch load lock apparatus 106A may operate in conjunction with first carousel 412A located opposite across the transfer chamber 402 therefrom. Second batch load lock apparatus 106B may operate in conjunction with carousel 412B located opposite across the transfer chamber 402 therefrom. As such, robot 408, which is described in U.S. Provisional Application 61/879,076 filed Sep. 17, 2013, and which is incorporated by reference herein it its entirety for all purposes, may exchange wafers between the first batch load lock apparatus 106A and the first carousel 412A, as the second carousel 412B is processing. When the second carousel 412B is finished processing, the robot 408 may exchange wafers between the second batch load lock apparatus 106B and the second carousel 412B, while the first carousel may undergo processing.

Figure 7:
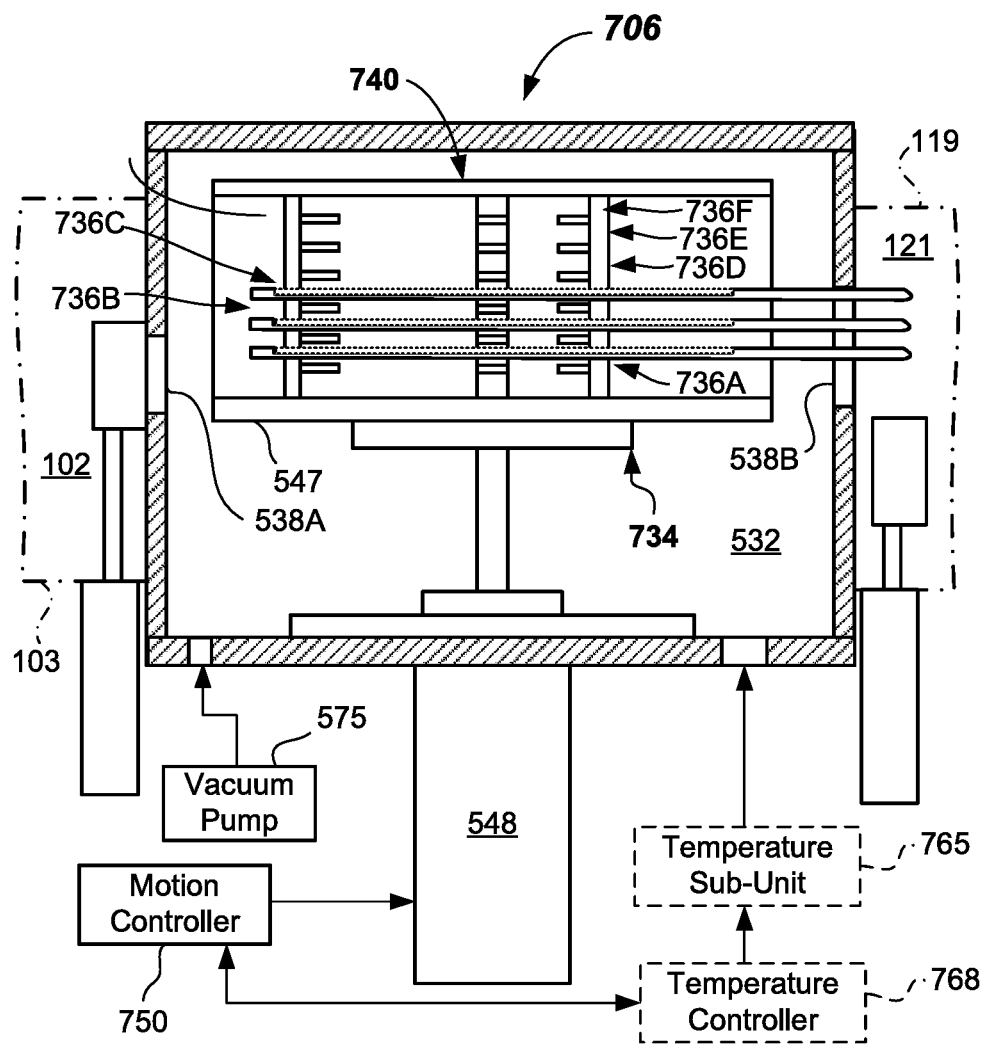
FIG. 7 illustrates another batch load lock apparatus with or without temperature control according to embodiments.

FIG. 7 illustrates another embodiment of batch load lock apparatus 706. This embodiment includes a support stack 740 that is coupled to a base 547, and moveable via the action of a primary actuator 548, via control signals from a motion controller 750. The lift assembly 734 may be moved to align the desired wafer stations 736A-736F with the respective load lock openings 538A, 538B to load and unload wafers 110.

In one embodiment, no heating or cooling may be provided. In another embodiment, heated or cooled gas (e.g., $N_2$ gas) may be introduced into the load lock chamber 532 from the temperature sub-unit 765 as controlled by the temperature controller 768 to heat or cool the wafers 110 in the load lock chamber 532. Gas flow may be over and around the wafers 110 and may be pass-through only, i.e., exiting through an exhaust (not shown), or may be recirculating back through the temperature sub-unit 765 in some embodiments. A vacuum may be drawn as stated herein after suitable heating of the wafers. Cooling may be accomplished after the vacuum is removed, for example, by introducing a cooling gas (cooled $N_2$ gas), for example.

Figure 8:
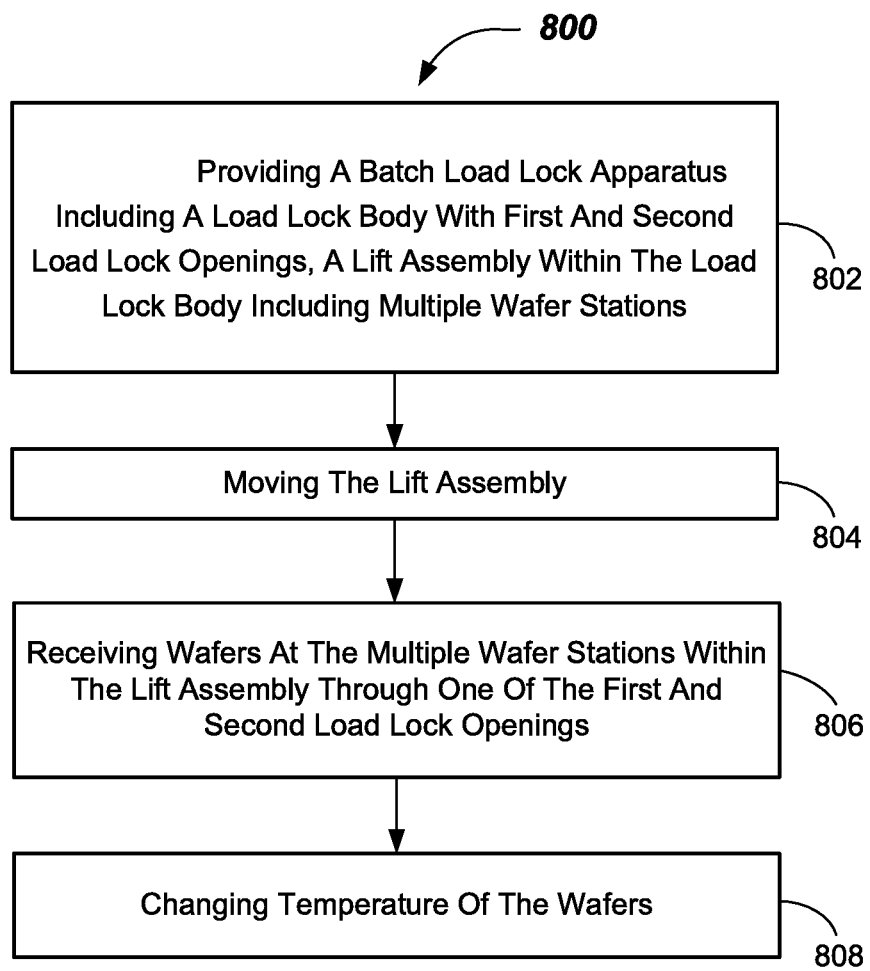
FIG. 8 illustrates a flowchart of a method of operating a batch load lock apparatus according to embodiments.

FIG. 8 illustrates a method 800 of operating a load lock apparatus, such as the batch load lock apparatus 106. The method 800 includes, in 802, providing a batch load lock apparatus (e.g., batch load lock apparatus 106) including a load lock body (e.g., load lock body 530) with first and second load lock openings (e.g., first and second load lock openings 538A, 538B), a lift assembly (e.g., lift assembly 534) within the load lock body including multiple wafer stations (e.g., wafer stations 536A-536G). Some or all of wafer stations 536A-536G may include temperature control platforms (e.g., temperature control platforms 554).

The method 800 includes, in 804, moving the lift assembly (e.g., lift assembly 534, 634, 734). The moving may be accomplished by moving the base (e.g., base 547) of the lift assembly (e.g., lift assembly 534, 634, 734) through action of a primary actuator (e.g., primary actuator 548—See FIGS. 5A-5E, 6 and 7), which simultaneously moves the various wafer stations (e.g., wafer stations 536A-536G, 736A-736F) to a desired vertical location. This movement aligns one or more of the desired wafer stations (e.g., one or more of wafer stations 536A-536G, 736A-736F) with one of the load lock openings (e.g., load lock opening 538A, 538B) so that wafers 110 may be transferred into or out of the respective one or more wafer stations (e.g., wafer stations 536A-536G, 736A-736F).

As shown in FIGS. 5B-5C, wafers 110 may be transferred into and out of the batch load lock apparatus 106 from the factory interface chamber 121 singly or simultaneously in groups of two, three, or four, or even more wafers 110, for example. In the depicted embodiment, the wafers 110 may be simultaneously loaded or unloaded (two optional end effectors 125E2, 125E3 are shown) to or from the wafer stations (in this case 536B, 536C, and 536D—if three wafers are transferred at once). The lift assembly 534 may be moved again until all the wafer stations (536A-536G) are loaded or emptied. Loading may take place from the bottom to top.

While the batch load lock apparatus 106 is being loaded from the factory interface chamber 121, the slit valve door 574A on the side of the transfer chamber 102 may be closed and sealed, such that processing may take place in the process chambers (e.g., in carousels 112—FIG. 1, in process chambers 204A-204C—FIGS. 2 and 3, or one of carousels 412A, 412B—FIG. 4), and the slit valve door 574B may be open. When the batch load lock apparatus 106 is being loaded from the transfer chamber 102, the slit valve door 574B may be closed and sealed, and the slit valve door 574A may be open. Thus, as described above, the method 800 includes, in 806, receiving wafers (e.g., wafers 110) on the support stack (e.g., support stack 540, 740) at the multiple wafer stations (e.g., wafer stations 536A-536G, or 736A-736F) within the lift assembly (e.g., lift assembly 534, 734) through one of the first and second load lock openings (first and second load lock openings 538A, 538B).

The method 800 may include, in 808, changing temperature of the wafers 110 in the load lock chamber (e.g., load lock chamber 532). The change in temperature may be by way of thermal contact with the temperature control platforms (e.g., temperature control platforms 554, 654) or otherwise actively heating or cooling the wafers 110, such as described in FIG. 7. In the embodiments described in FIGS. 5A-6, multiple wafers 110 may be heated by bringing them into thermal contact with the temperature control platforms 554. In other embodiments, the wafers 110 may be cooled by bringing them into thermal contact with the temperature control platforms 654.

In embodiments where each wafer 110 is to be heated or cooled, the support stack 540 of the lift assembly 534, 634, after being loaded, may be relatively moved into close proximity to, i.e., into thermal contact with, the temperature control platforms 554, 654. Thermal contact may be in direct physical contact with, or close proximity to, in order to allow substantial change in temperature. This may be accomplished by moving the support stack 540 via the action of the secondary actuator 549 to cause relative movement between the support stack 540 and the temperature control stack 542, 652.

Example of Operation

The following is an example of the operation of the batch load lock apparatus 106. The example method includes, opening a first slit valve door, 574A or 574B, moving the support stack 540 of the lift assembly 534 to align wafers stations with one of the first and second load lock openings (538A or 538B depending on whether loading from factory interface chamber 121 or the transfer chamber 102), and loading wafers 110 into the support stack 540. One or more than one move of the lift assembly 543 may be used to load the desired number of wafers 110 therein. Next, the support stack 540 may be moved relative to the temperature control platforms 554 or 654 of the temperature control stack 542 to bring the wafers 110 into thermal contact with the temperature control platforms 554 or 654. The wafers 110 are then heated or cooled to the desired temperature. Heating and cooling time and temperature will depend on the allowed time and capability of the temperature control stack 542, 642. Changes in temperature of the wafers 110 of 100° C., or even up to 300° C. or more, may be achieved. Once sufficiently heated or cooled, the support stack 540 may be moved relative to the temperature control platforms 554 to separate the wafers 110 from the temperature control platforms 554. The second slit valve door may be opened, and the wafers 110 may be unloaded. In the case of heating, the second slit valve door may be the slit valve door to the transfer chamber, and the wafers may be moved into the respective process chambers (e.g., 104, 104A-104C) for processing. In the case of cooling, the wafers may be cooled on reentering the factory interface 120 and be ready for loading directly into wafer carriers 122.

Wafers should be unloaded/loaded in the order of top to bottom or bottom to top, in order to prevent processed wafers from being above unprocessed wafers. For a wafer exchange from the factory interface chamber 121, the exchange should take place top to bottom, thus exchanging the processed wafers first. In the case of exchange from the side of the transfer chamber 102, exchange should be bottom to top.

A complete example of an exchange from the batch load lock apparatus 106 starting with a processed batch in the batch load lock apparatus 106, which has had cooling completed thereon, is as follows:

1) Open slit valve door 538B on side of factory interface 120;
2) Move load/unload robot 125 into batch load lock apparatus to remove wafers 110 that have been processed from the lower wafer stations (e.g., 536B, 536C, and 536D) of the lift assembly 534;
3) Move wafers 110 that have been processed with load/unload robot 125 from batch load lock apparatus 106 to a buffer station (not shown);
4) Move wafers 110 to be processed with load/unload robot 125 from buffer station to batch load lock apparatus 106;
5) Index the lift assembly 534;
6) Repeat 3) and 4);
7) Close slit valve door 538B;
8) Pump to desired vacuum level with vacuum pump 575 (e.g., via single or dual stage evacuation to 20 Torr or higher vacuum);
9) Open slit valve door 574A;
10) Extend robot 108 into batch load lock apparatus 106;
11) Remove wafer 110 with robot 108 and transfer to processing chamber (e.g., 104, 104A-C);
12) Reload wafer 110 that has been processed into batch load lock apparatus 106;
13) Continue 11) and 12) until the batch load lock apparatus 106 is full as desired (the exchange may occur from bottom to top);
14) Close slit valve door 574A; and
15) Cool wafers.

Wafers may be cooled as previously described, by bringing the wafers 110 into thermal contact with the temperature control platforms 554. Cooling may be active, i.e., withdrawing heat at a rate faster than capable through a passive heat sink.

Accordingly, while the disclosure has been disclosed in connection with example embodiments thereof, it should be understood that other embodiments may fall within the scope of the disclosure, as defined by the following claims.

What is claimed is:

1. A batch load lock apparatus, comprising:
   a support stack including three or more support members configured to support wafers; and
   a temperature stack including a plurality of temperature control platforms, wherein the support stack is vertically moveable relative to the temperature stack, and wherein three or more of the plurality of temperature control platforms each provide individual thermal treatment of a respective wafer of the wafers.

2. The batch load lock apparatus of claim 1, wherein the three or more support members are configured to move as a group.

3. The batch load lock apparatus of claim 1, wherein at least one of the plurality of temperature control platforms is configured to heat a wafer.

4. The batch load lock apparatus of claim 1, wherein at least one of the plurality of temperature control platforms includes a resistive heater.

5. The batch load lock apparatus of claim 1, wherein at least one temperature control platform of the plurality of temperature control platforms includes a plurality of fluid passages that are continuous and that are configured to heat a wafer set upon the at least one temperature control platform by flowing a fluid through the plurality of fluid passages.

6. The batch load lock apparatus of claim 1, wherein the batch load lock apparatus is configured to couple between a mainframe body of a transfer chamber and a factory interface body of a factory interface.

7. The batch load lock apparatus of claim 1, wherein the support stack including the three or more support members configured to support wafers are also configured to receive multiple stacked end effectors.

8. The batch load lock apparatus of claim 1, wherein the three or more support members further comprise a plurality of wafer supports attached to the three or more support members, wherein the plurality of wafer supports comprise fingers extending horizontally underneath the wafers.

9. The batch load lock apparatus of claim 1, wherein the support stack is moveable vertically by an actuator.

10. The batch load lock apparatus of claim 1, wherein the plurality of temperature control platforms are at spaced intervals with fixed spacing on a distribution riser, the plurality of temperature control platforms providing wafer temperature control capability within the batch load lock apparatus.

11. A wafer processing system, comprising:
a transfer chamber; and
a batch load lock apparatus coupled to the transfer chamber, the batch load lock apparatus, comprising:
a support stack including three or more support members configured to support wafers; and
a temperature stack including a plurality of temperature control platforms, wherein the support stack is vertically moveable relative to the temperature stack, and wherein three or more of the plurality of temperature control platforms each provide individual thermal treatment of a respective wafer of the wafers.

12. The wafer processing system of claim 11, further comprising a robot configured to exchange wafers between the batch load lock apparatus and a processing chamber coupled to the transfer chamber.

13. The wafer processing system of claim 11, wherein the support stack including the three or more support members configured to support wafers are also configured to receive multiple stacked end effectors from the transfer chamber.

14. The wafer processing system of claim 11, wherein the three or more support members further comprise a plurality of wafer supports attached to the three or more support members, wherein the plurality of wafer supports comprise fingers extending horizontally underneath the wafers.

15. The wafer processing system of claim 11, wherein the support stack is moveable vertically by an actuator to bring the wafers into thermal contact with respective ones of the plurality of temperature control platforms.

16. The wafer processing system of claim 11, comprising a factory interface including a factory interface robot having two or more end effectors.

17. The wafer processing system of claim 11, wherein the plurality of temperature control platforms are at spaced intervals with fixed spacing on a distribution riser, the plurality of temperature control platforms providing wafer temperature control capability within the batch load lock apparatus.

18. A wafer processing system, comprising:
a factory interface including a factory interface robot having two or more end effectors; and
a batch load lock apparatus coupled to the factory interface, the batch load lock apparatus, comprising:
a support stack including three or more support members configured to support wafers received from the two or more end effectors; and
a temperature stack including a plurality of temperature control platforms, wherein the support stack is vertically moveable relative to the temperature stack, and wherein three or more of the plurality of temperature control platforms each provide individual thermal treatment of a respective wafer of the wafers.

19. The wafer processing system of claim 18, wherein the plurality of temperature control platforms are at spaced intervals with fixed spacing on a distribution riser, the plurality of temperature control platforms providing wafer temperature control capability within the batch load lock apparatus.

* * * * *